US007415395B2

(12) United States Patent
Khan

(10) Patent No.: US 7,415,395 B2
(45) Date of Patent: Aug. 19, 2008

(54) SYMBOLIC EVALUATION ENGINE FOR HIGH-PERFORMANCE SIMULATIONS

(75) Inventor: Mohammed Asif Khan, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 923 days.

(21) Appl. No.: 10/024,359

(22) Filed: Dec. 21, 2001

(65) Prior Publication Data

US 2003/0120467 A1 Jun. 26, 2003

(51) Int. Cl.
G06F 7/60 (2006.01)
G06F 17/10 (2006.01)
G06F 17/50 (2006.01)
(52) U.S. Cl. .................................. 703/2; 703/13; 716/4
(58) Field of Classification Search .................. 703/2, 703/13; 716/4
See application file for complete search history.

(56) References Cited

U.S. PATENT DOCUMENTS

| 6,556,954 | B1 * | 4/2003 | Denk et al. ................. 702/185 |
| 2003/0105618 | A1 * | 6/2003 | Estevez-Schwarz .......... 703/14 |
| 2003/0154059 | A1 * | 8/2003 | Feldmann et al. ............. 703/2 |
| 2004/0133407 | A1 * | 7/2004 | Reissig ......................... 703/2 |
| 2005/0071137 | A1 * | 3/2005 | Selvaraj et al. ................. 703/6 |
| 2005/0107895 | A1 * | 5/2005 | Pistikopoulos et al. ........ 700/52 |

OTHER PUBLICATIONS

Feehery, W.F. et al. "A Differentiation-Based Approach to Dynamic Simulation and Optimization with High-Index Differential-Algebraic Equations." SIAM Computational Differentiation, ® 1996. pp. 239-253.*

"Publications of Paul I. Barton." http://yoric.mit.edu/publications. Printed Nov. 23, 2005.*

Le Lann, J.M. et al. "Dynamic Simulation of Partial Differential Systems: Application to Some Chemical Engineering Problems." 3rd ICL Joint Conf. Jul. 16-18, 1998.*

"Publications & Communications." http://www.prosim.net/publication. Printed Nov. 23, 2005.*

Martinson, W. et al. "A Differentiation Index for Partial Differential-Algebraic Equations." SIAM J. Sci. Comput. ® 2000. vol. 21, No. 6, pp. 2295-2315.*

Pytlak, R. et al. "Optimal Control of Differential-Algebraic Equations without Impulses." Proc. of the 33rd Conf. on Decision and Control. Dec. 1994. pp. 951-956.*

Park, Taeshin et al. "State Event Location in Differential Algebraic Models." ACM Transactions on Modeling and Computer Simulation (TOMACS). Apr. 1996. vol. 6, Issue 2. pp. 137-165.*

(Continued)

*Primary Examiner*—Paul L Rodriguez
*Assistant Examiner*—Dwin M Craig
(74) *Attorney, Agent, or Firm*—Finnegan, Henderson, Farabow, Garrett & Dunner

(57) ABSTRACT

A method is provided of simulating a system. The method defines equations modeling the system using terms having characteristics encapsulated within the term. Next, the method performs symbolic processing on the established equations for simplification. Additionally, the method performs system processing on the established equations for efficient simulation. Aspects of some embodiments of the described invention include a method of symbolically processing a set of equations, a method of eliminating an integral in a Pantelides algorithm, and a method of tearing block equation blocks.

60 Claims, 7 Drawing Sheets

OTHER PUBLICATIONS

Zitney, S.E. et al. "Sparse Matrix Methods for Chemical Process Separation Calculations on Supercomputers." Proc. 1992 ACM/IEEE Conf. on High Performance Networking and Computing. 1992. pp. 414-423.*

"3.1 Associating Objects in C++". http://people.cs.vt.edu/>kafura/cs2704/intro2.html. Last updated: Jul. 3, 1996 Printed: Nov. 23, 2005.*

"Computational Differentiation: Techniques, Applications, and Tools, Proc. AD1996, Santa Fe, New Mexico." http://bt.pa.msu.edu/papers-cgi/display.pl?name=sfbook. Printed from the Internet on Jun. 9, 2006.*

"U.S. Copyright Office Search for TX-4-442-865". http://www.loc.gov/cgi-bin/formprocessor/copyright/locis.pl. Printed from the Internet on Jun. 9, 2006.*

"Second International Workshop on Computational Differentiation, Feb. 12-15, 1996. La Fonda Hotel. Santa Fe, New Mexico". http://bt.pa.msu.edu/cd96/program.html. Dated Jan. 3, 1996. Printed from the Internet on Jun. 9, 2006.*

"Session 9". http://bt.pa.msu.edu/cd96/s9.html. Dated Dec. 28, 1995. Printed from the Internet on Jun. 9, 2006.*

"Workshop Program". http://www-unix.mcs.anl.gov/autodiff/Santa_Fe/abstracts. Undated. Printed from the Internet on Jun. 9, 2006.*

Pye, John. "Pantelides Algorithm in PHP." Last modified May 16, 2005. http://pye.dyndns.org/pantelides/.*

Cellier, Francois. "The Structural Singularity Removal Algorithm by Pantelides." Sep. 15, 2003. http://www.ece.arizona.edu/~cellier/ece449_ppt.pdf.*

Cellier, F.E. and H. Elmqvist. "Automated Formula Manipulation Supports Object-Oriented Continuous-System Modeling." IEEE Control Systems Magazine. Apr. 1993. vol. 13, Issue 2, pp. 28-38.*

Pantelides, C., "The Consistent Initialization of Differential-Algebraic Systems", SIAM Journal of Scientific and Statistical Computing, vol. 9, 1988, pp. 213-231.

Tarjan, R.E., "Depth First Search and Linear Graph Algorithms", SIAM Journal of Computing, vol. 1, 1972, pp. 146-160.

Duff, I.S., et al., "An Implementation of Tarjan's Algorithm for the Block Triangularization of a Matrix", ACM Transactions on Mathematical Software, vol. 4, No. 2, Jun. 1978, pp. 137-147.

* cited by examiner

SYMBOLIC EVALUATION ENGINE FOR HIGH-PERFORMANCE SIMULATIONS

TECHNICAL FIELD

The invention relates to the field of computer simulation, and more specifically, a method of analyzing and predicting the behavior and performance of a system through a computer simulation.

BACKGROUND

A simulation application provides a computer-based method of analyzing and predicting the behavior and performance of a system. A typical application will require a user to construct a model of the system by adding and connecting components. These components provide a mathematical representation of simple or complex physical phenomena in the form of equations. The application will collect and process the equations to a form that can be readily simulated using a numeric integration technique.

Typically, time domain systems are used to model systems by performing a numeric analysis of the system, with very little manipulation performed symbolically prior to simulation. This set of equations is put together in the form of ordinary differential equations or differential algebraic equations. Unfortunately, because little manipulation is done symbolically prior to simulation, the simulation is not optimized for speed. In other words, current systems fail to optimize for improved execution time, and in some cases may not be solvable at all.

Constantinos C. Pantelides in "The Consistent Initialization of Differential-Algebraic Systems" describes a method of analyzing differential equations. The method identifies equations that constrain integrated variables. These equations are differentiated a number of times to determine the complete set of system constraints. While Pantelides simplifies the differential equations, the algorithm fails to identify variables that are to be constrained by the additional differentiated equations resulting from Pantelides. Sven E. Mattson and Gustaf Soderlind in "Index Reduction in Differential Algebraic Equations Using Dummy Derivatives" describe a method of dynamically selecting the constrained variables. The dynamic selection results in substantial performance degradation due to the overhead of the selection process and because the solution must be restarted whenever the constrained variables change.

The prior art does not provide a simulation application that increases the ease of constructing a model, while minimizing the computational effort required to simulate it. The present invention is directed to overcoming one or more of the existing disadvantages in prior art systems.

SUMMARY OF THE INVENTION

An embodiment of the present invention provides for a method of simulating a system. The method establishes equations modeling the system using terms having characteristics encapsulated within the term. Next, the method performs symbolic processing on the established equations for simplification. Additionally, the method performs system processing on the established equations for efficient simulation.

Another embodiment of the present invention provides a machine-readable storage medium having stored thereon machine executable instructions, the execution of the instructions being adapted to implement a method of simulating a system. The method defines equations modeling the system using terms having characteristics encapsulated within the term. Next, the method performs symbolic processing on the established equations for simplification. Additionally, the method performs system processing on the established equations for efficient simulation.

Additional embodiments of the present invention provide a method of symbolically processing a set of equations. The method includes assigning a portion of the set of equations to variables that have non-zero partial derivatives, and differentiating the remainder of the set of equations. Next, the method approximates an algebraic derivative for those equations that cannot by symbolically differentiated. The method includes symbolically integrating equations that cannot be assigned, followed by differentiating equations that add output derivates and integrating equations that add output integrals. Finally, the method eliminates an integral as each symbolically differentiated or integrated equation eliminates a numeric integration, such that the integral is converted to an algebraic variable by eliminating the derivative or integral relationship.

Another embodiment of the present invention provides a machine-readable storage medium having stored thereon machine executable instructions, the execution of the instructions being adapted to implement a method of symbolically processing a set of equations. The method includes assigning a portion of the set of equations to variables that have non-zero partial derivatives, and differentiating the remainder of the set of equations. Next, the method approximates an algebraic derivative for those equations that cannot by symbolically differentiated. The method includes symbolically integrating equations that cannot be assigned, followed by differentiating equations that add output derivates and integrating equations that add output integrals. Finally, the method eliminates an integral as each symbolically differentiated or integrated equation eliminates a numeric integration, such that the integral is converted to an algebraic variable by eliminating the derivative or integral relationship.

Additional embodiments of the present invention provide a method of eliminating an integral in a Pantelides algorithm. The method includes assigning a preferred integration location rank to one or more integrals. Utilizing the preferred integration location rank, integrals are assigned to equations. Next, the method eliminates the integration of assigned or solved integral variables.

Another embodiment of the present invention provides a machine-readable storage medium having stored thereon machine executable instructions, the execution of the instructions being adapted to implement a method of eliminating an integral in a Pantelides algorithm. The method includes assigning a preferred integration location rank to one or more integrals. Utilizing the preferred integration location rank, integrals are assigned to equations. Next, the method eliminates the integration of assigned or solved integral variables.

Other embodiments of the present invention provide a method of block tearing equations. The method includes identifying variables in the equations in a block in which the variables appear linearly with constant coefficients. Next, the method solves nonlinear integration equations for their respective integrals, and determines the solvability of the nonlinear equations. Next, the method solves the linear equations, and solves the nonlinear equations utilizing iterates and block variables solved from the linear equations. The method scans for solved for variables for identification of variables that are independent and may be removed from the block.

Another embodiment of the present invention provides a machine-readable storage medium having stored thereon machine executable instructions, the execution of the instructions being adapted to implement a method of block tearing equations. The method includes identifying variables in the equations in a block in which the variables appear linearly with constant coefficients. Next, the method solves nonlinear integration equations for their respective integrals, and determines the solvability of the nonlinear equations. Next, the method solves the linear equations, and solves the nonlinear equations utilizing iterates and block variables solved from the linear equations. The method scans for solved for variables for identification of variables that are independent and may be removed from the block.

Another embodiment of the present invention provides for a method of simulating a system. The method establishes equations modeling the system using terms having characteristics encapsulated within the term. Next, the method performs symbolic processing on the established equations for reducing the number of terms. Additionally, the method performs system processing on the established equations for efficient simulation.

Another embodiment of the present invention provides for a method of simulating a component. The method establishes equations modeling the component using terms having characteristics encapsulated within the term. Next, the method performs symbolic processing on the established equations for simplification. Additionally, the method performs system processing on the established equations for efficient simulation.

BRIEF DESCRIPTION OF THE DRAWINGS

The accompanying drawings, which are incorporated in and constitute a part of this specification, illustrate one embodiment of the invention and together with the description, serve to explain the principles of the invention.

DETAILED DESCRIPTION

Reference will now be made in detail to the present exemplary embodiments of the invention, examples of which are illustrated in the accompanying drawings. Wherever possible, the same reference numbers will be used throughout the drawings to refer to the same or like parts.

An embodiment of the present invention provides for a method of simulating a system. The method establishes equations modeling the system using terms having characteristics encapsulated within the term. Next, the method performs symbolic processing on the established equations for simplification. Additionally, the method performs system processing on the established equations for efficient simulation.

Figure 1:
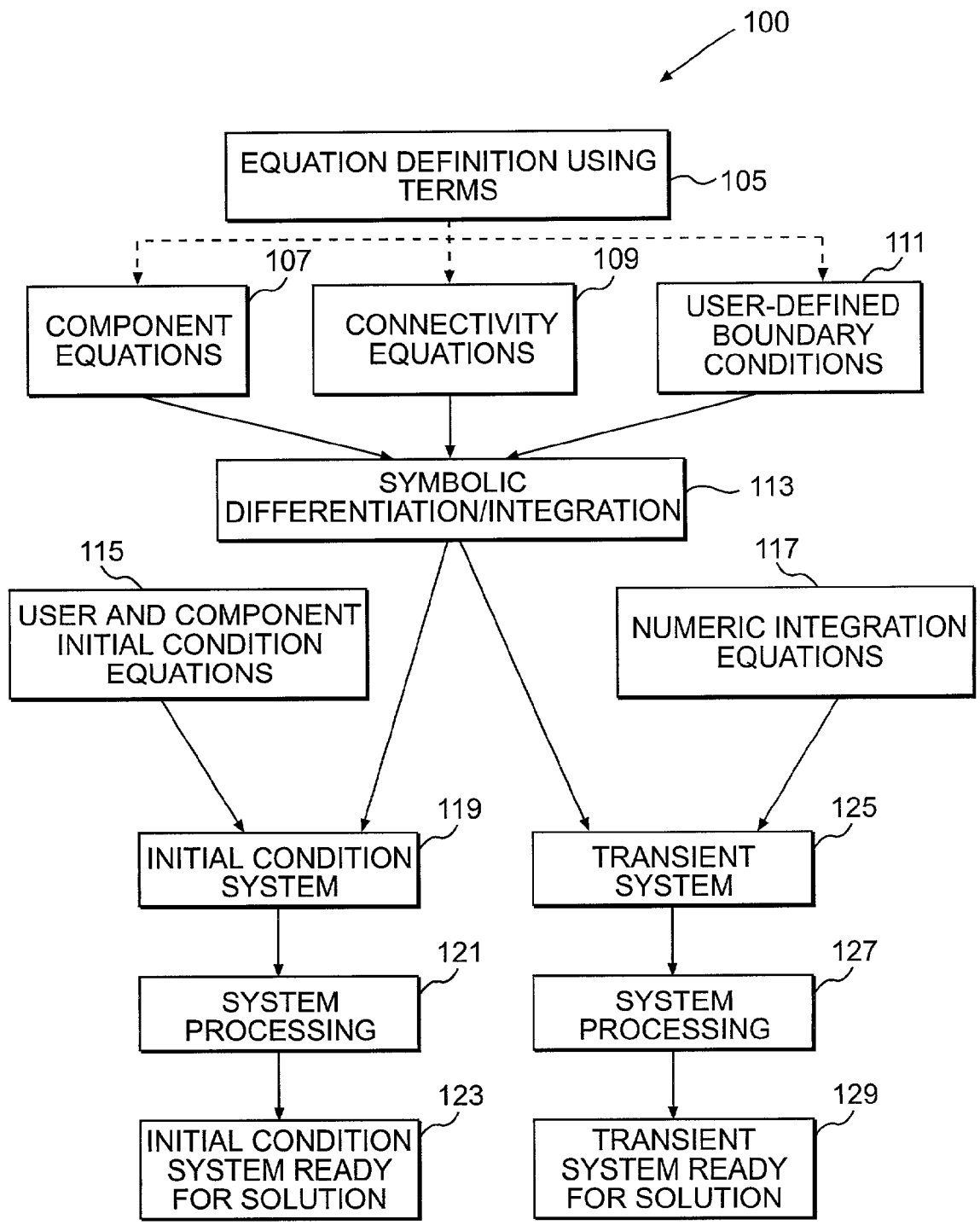
FIG. 1 is a flowchart illustrating an overview of the simulation application for an exemplary embodiment of the present invention.

FIG. 1 is a flowchart illustrating an overview of the simulation application for an exemplary embodiment of the present invention. The simulation 100 includes a number of processes that may operate sequentially or simultaneously depending upon their relationship as indicated in the figure. Detailed explanations of each process in the system will be provided at the appropriate portions of this specification. As an overview, at stage 105, equations are established using terms. Terms are newly defined building blocks for modeling a system. At stage 107, component equations are defined; at stage 109 connectivity equations are defined; and at stage 111, user-defined boundary conditions are defined. At stage 113, symbolic differentiation and/or integration occurs, thus simplifying the equations for modeling during runtime. At stage 115, user and component initial condition equations may be defined, establishing the initial condition of the system. At stage 117, numeric integration equations may be defined and used in the establishment of the transient portion of the modeling of the system.

Processing for the initial condition system and the transient system may be separated and performed in parallel processing, thus leading to efficiencies in modeling and execution. Thus stages 119, 121, and 123 of the initial condition system correspond in processing to stages 125, 127 and 129, respectively, of the transient system. At stages 119, 125 the initial condition and transient system receives their inputs. At stages 121, 127, system processing occurs. At stages 123, 129, the systems are ready for solution. Thus, systems are generated for simulation that are easier to construct and provide for a speedier and more easily repeated solution.

Term building and equation definition will now be more fully described. A model is built by connecting components. A component mathematically represents some physical behavior by the equations associated with the component. The following example illustrates a component and it associated equations. For example, a component that models the translational acceleration of a point mass may be associated with the following equation:

$$0 = F - ma$$

where F is the force applied, m is the mass, and a is the acceleration of the point mass. Here F and a are unknown variables and the causality of the equation has not been specified (i.e. is the equation solved for F or a).

In the symbolic engine of an embodiment of the present invention, equations may be represented as a sum of terms:

$$0 = T_1 + T_2 +$$

A library of terms may be established, and may include basic terms, composite terms and collection terms. Basic terms include, for example, constants (e.g. 3.1) and scalars (e.g. 2x). Composite terms include, for example, exponents (e.g. $T^2$) and curve interpolation ($C(x, y)$. Collection terms include, for example, summation ($T_1 + T_2 + T_3$) and products ($T_1 * T_2 * \sin(T_3)$). Those skilled in the art will appreciate that other types of basic terms, composite terms, and collection terms could be used and are contemplated by embodiments of the invention. In addition, those skilled in the art will realize that other types of terms, other than basic, composite and collection, could also be used.

Each term in the library may perform one or more mathematical operations on itself, such as, Evaluate, Simplify, Factorize, Differentiate, Integrate, and Invert. Other various mathematical functions can also be included in the library as the developer of a system may deem appropriate for implementation.

Those skilled in the art will appreciate that this term approach simplifies the implementation of the symbolic engine as characteristics of a term class are encapsulated within the term and are transparent to the engine. The library can also be easily extended by defining new term classes to, for example, model the pressure drop across a hydraulic valve, or the body-to-global coordinate transformation matrix of a 3-D body. Because the library may be constructed by those having greater understanding of the physics of a system, less knowledgeable individuals may use such a library without the need to understand all of the underlying characteristics. In other words, those modeling a system need not have detailed knowledge of the operation of individual objects or components.

In one embodiment, the terms are implemented in object oriented programming. In addition to the use of object oriented terms, embodiments of the present invention may also use a term group. Term groups enable multiple terms to be evaluated together. In some cases it may be more efficient or convenient to evaluate a group of terms together. For example, a component that interfaces a user-code function to produce three outputs ($f_1, f_2, f_3$) given four inputs ($I_1, I_2, I_3, I_4$), would be associated with the following term group of equations:

$$0 = O_1 - f_1(I_1, I_2)$$

$$0 = O_2 - f_2(I_1, I_3, I_4)$$

$$0 = O_3 - f_3(I_2, I_3, I_4)$$

Although the equations appear to contain three independent functions ($f_1, f_2, f_3$), they may be evaluated simultaneously as a term group when the user code is executed. The user code may be executed multiple times. However, for improved efficiency, the user code may not be executed multiple times. The symbolic engine handles such a case by using a new entity called a term group. A term group is a container that evaluates a specified function and stores the resulting values. These values are accessed in equations through an access term called a term group item.

A flag may be set such that the function is evaluated only when the first term group item requests its value. Subsequent term group items access values stored in the term group following the initial evaluation. Using this approach prevents the function from being reevaluated for each item and allows the items to appear in the equations in any arbitrary order. For example:

$$0 = O_1 - if(x > y) \text{ then } T_{G1}(I_1, I_2) \text{ else } 2.0$$

$$0 = O_3 - T_{G3}(I_2, I_3, I_4)$$

$$0 = O_2 - T_{G2}(I_1, I_3, I_4)$$

In the above equations, upon a request to evaluate $O_1$, if the condition in the first equation is false, the function in the term group need not be evaluated. However, when a request for evaluation of $O_3$ is requested, $T_{G3}$ accesses its value, triggering the evaluation of all terms in the term group. On a later evaluation of the third equation, the value of $T_{G2}$ may be recovered from storage within the term group.

Figure 2:
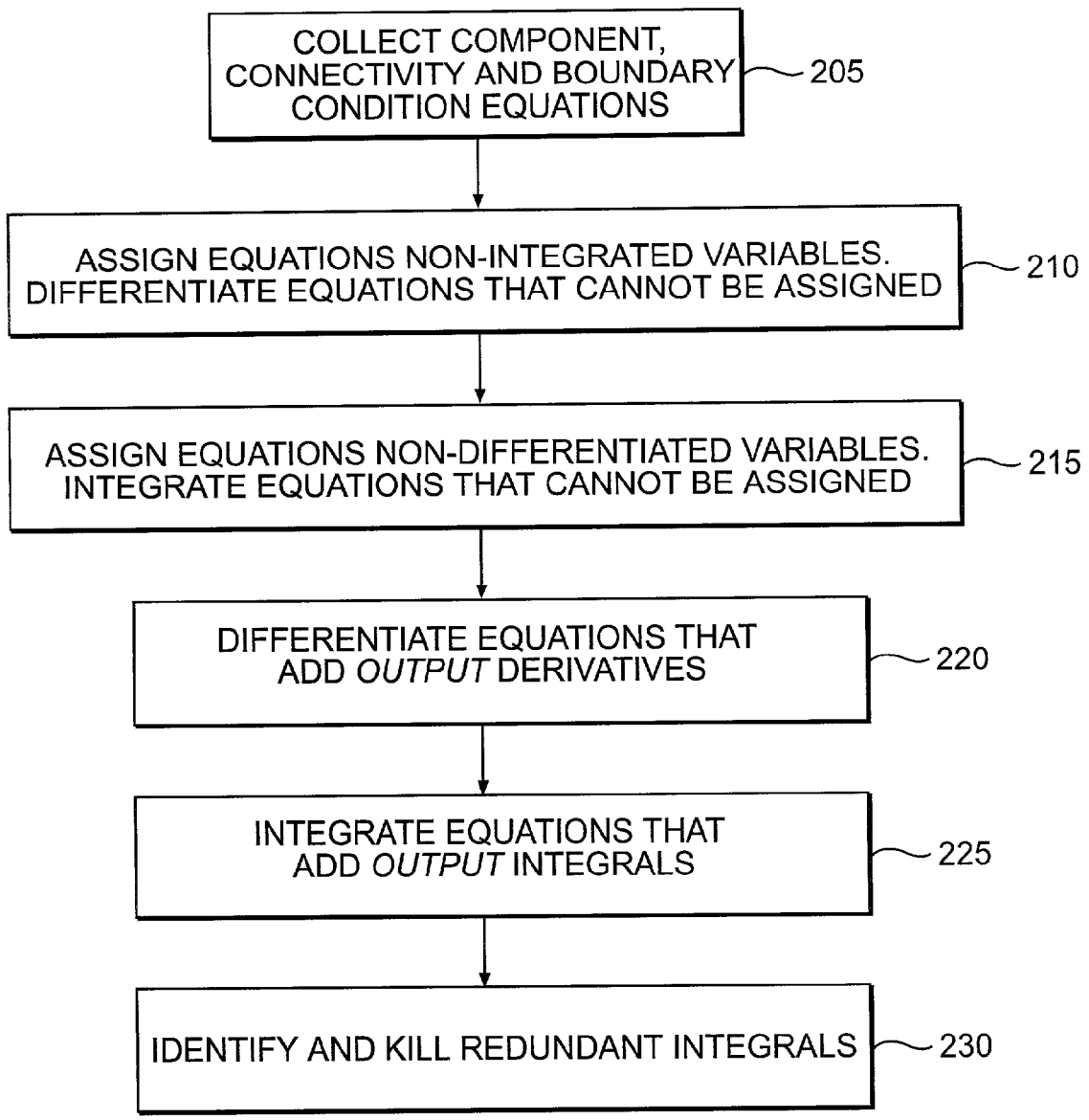
FIG. 2 is a flowchart of the symbolic engine for an exemplary embodiment of the present invention.

FIG. 2 illustrates a flowchart of the symbolic engine for an exemplary embodiment of the present invention. At stage 205, the symbolic engine 113 assembles all the equations that collectively define the behavior of the model. These may include: the equations written by components contained in the model 107, connection equations that govern how components interact with one another 109, and boundary constraint equations specified by the user 111. The result may be a differential-algebraic system of equations (DAE) that can be simulated using numeric integration. The symbolic engine 113 performs extensive processing on the DAE system to put it in a form that can be efficiently simulated.

The transient system of equations often has a DAE index (the number of times the equations may be differentiated to allow for the solution of the derivatives) of greater than one. Directly solving such a system effectively determines some derivatives using numeric differentiation. This can result in significant loss of accuracy in simulation results or iterative convergence failure. Therefore, in one exemplary embodiment, the symbolic engine uses a modified form of the well-known algorithm by Pantelides to reduce the system to a DAE index of at most one. The algorithm is based on an efficient recursive scheme of assigning equations non-integrated variables. If an equation cannot be assigned, it is differentiated along with all the equations assigned to its incident variables. Three modifications have been made to the Pantelides algorithm, and are illustrated in FIG. 2:

First, at stage 210, assignment of equations is restricted to variables that have non-zero partial derivatives. This improves the handling of discrete systems by limiting the propagation of the variable coloring scheme of Pantelides. For example, in the following set of equations:

$$0 = S_1 - f_1(t)$$

$$0 = S_2 - if(S_1 > 0) \text{ then } 1 \text{ else } 2$$

$$0 = S_2 - f_3(t)$$

The first and second equations are assigned $S_1$ and $S_2$, respectively. The third equation cannot be assigned a variable and so it, and the second equation, are differentiated. Limiting assignment to variables with non-zero partial derivatives avoids the differentiation of the first equation. This is especially important if $f_1$ is not a differentiable function.

Also, at stage 210, if an equation cannot be symbolically differentiated, an approximate/algebraic derivative equation is used. For example if in the above set of equations $f_3$ is not differentiable, the derivative of the third equation can be approximated by:

$$0 = S_2 - (S_2 - \text{last}(S_2))/h$$

Where h is the integration time step.

At stage 215, the above stages are repeated assigning equations non-differentiated variables. Equations that cannot be assigned are, if possible, symbolically integrated. This further reduces the number of variables that are numerically integrated.

At stages 220, equations are differentiated that add output derivatives. At stage 225, equations are integrated that add output integrals. In addition to the equations differentiated and integrated in stages 210 and 215, the engine symbolically differentiates or integrates equations that provide more information to the user without increasing the number of numerically integrated variables in the model. These additional derivatives or integrals are referred to as output variables. For example, a simple gearbox writes the following equation:

$$0 = \omega_1 - 2\omega_2$$

Where $\omega_1$ and $\omega_2$ are the angular velocities of the two gears. If the derivative of $\omega_1$ ($\alpha_1$) is defined in the model but not the derivative of $\omega_2$ ($\alpha_2$), the above equation is differentiated to give:

$$0 = \alpha_1 - 2\alpha_2$$

Here $\alpha_2$ is added to the model, but is an algebraic variable that is determined by the above equation. Similarly, if the integral of $\omega_1$ ($\theta_1$) is defined but not the integral of $\omega_2$ ($\theta_2$), the gearbox equation is symbolically integrated to give:

$$0 = \theta_1 - 2\theta_2$$

At stage 230, as each symbolically differentiated/integrated equation eliminates a numeric integration, an integral should be eliminated, i.e., the integral may be converted to an algebraic variable by eliminating the derivative-integral relationship. Pantelides does not identify which set of integrals should be eliminated. To determine the integrals to eliminate, the symbolic engine uses a new process that is based on the concept of a preferred integration location. A preferred integration location (PIL) is a hint from the user or component developer that given a choice, the integration of a specified variable is to be preferred over all other variables.

Figure 3:
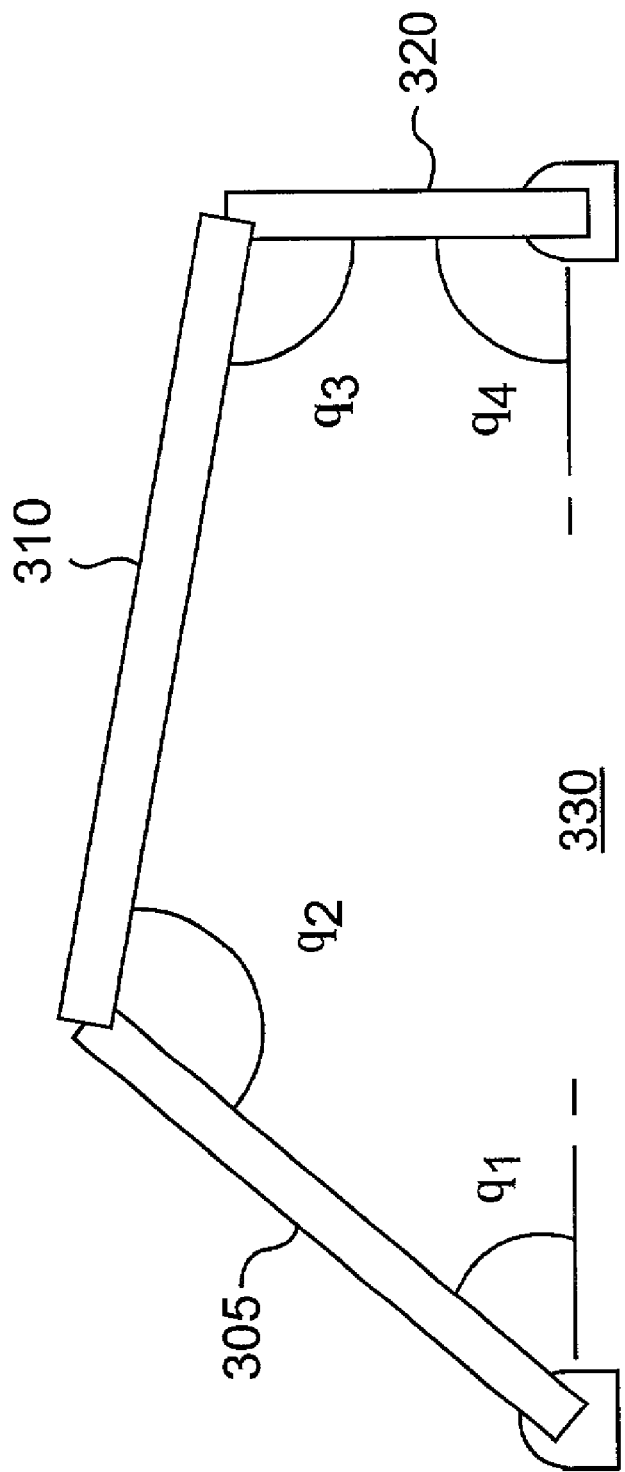
FIG. 3 is a diagrammatic illustration of a 2-D four-bar linkage model.

FIG. 3 illustrates a 2-D four-bar linkage model having an output arm 305, coupler arm 310, and crank arm 320. The model is located on a ground 330. One of the four angles must be integrated and the remaining three are determined by algebraic constraints. Integrating the angle of the crank arm 320 ($\theta_4$) is preferred as it will avoid singularities in the equations. Thus $\theta_4$ is a preferred integration location. Each PIL has an associated rank. User specified PILs may have the highest rank. PILs specified by a component developer can have one of several lower ranks. All other potential integration locations have a default rank. The symbolic engine tries to assign to each integral equation (i.e. an equation that has been differentiated or is the result of symbolic integration) an integral that has the lowest PIL rank. The process is repeated allowing assignment to higher PIL ranks until all integral equations have been assigned. The integrals assigned to the integral equations are converted to algebraic variables. To avoid assigning linearly redundant variables, the linear terms in the integral equations may be solved using Gauss Elimination.

Figure 4:
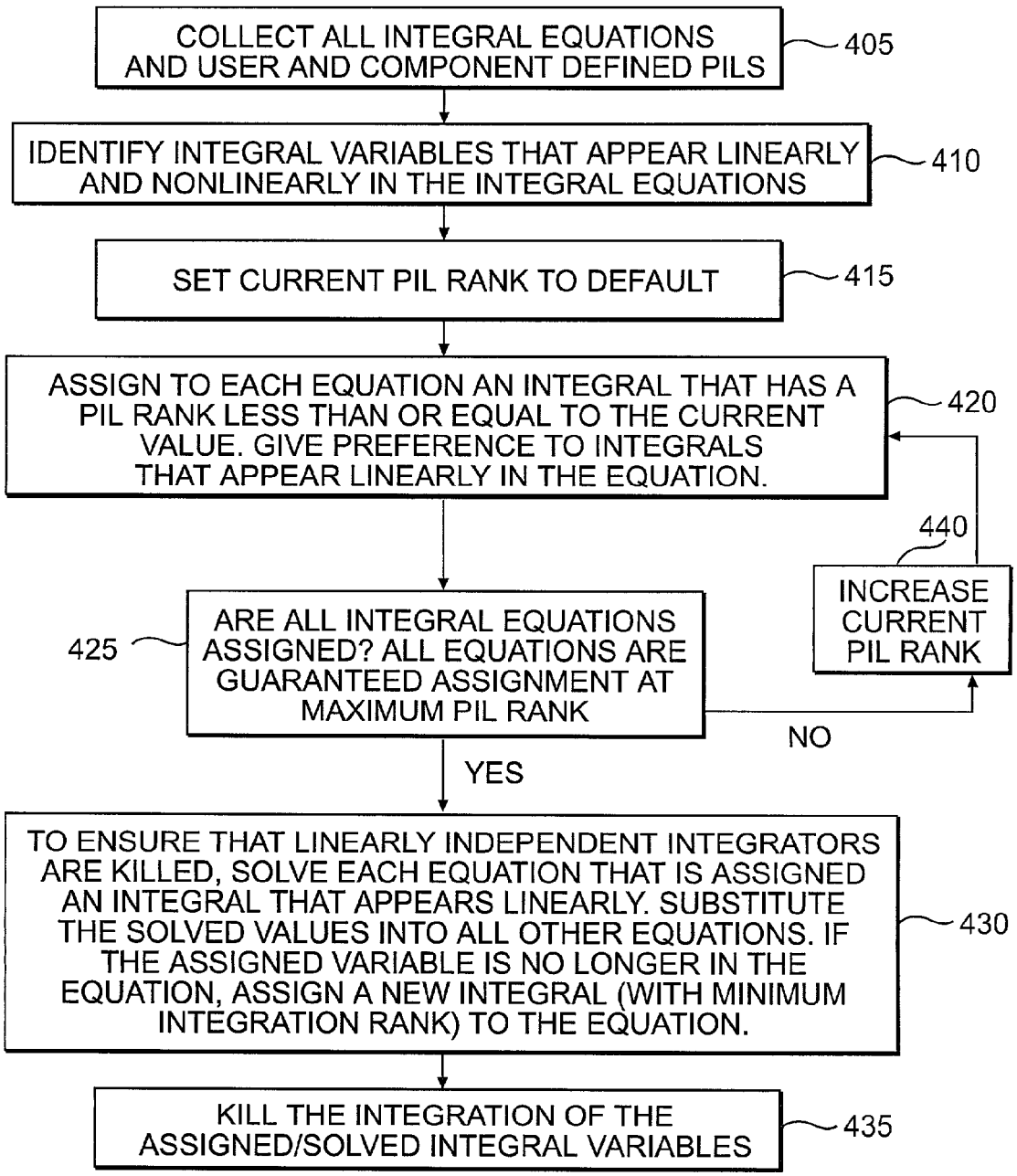
FIG. 4 is a flowchart of the redundant integral identification process for an exemplary embodiment of the present invention.

FIG. 4 illustrates a flowchart of the preferred integration location process for an exemplary embodiment of the present invention. At stage 405, the process collects all integral equations and user and component defined PILs. At stage 410, the process identifies integral variables that appear linearly and nonlinearly in the integral equations. At stage 415, the current PIL rank is set to the default setting. At stage 420, each equation may be assigned an integral that has a PIL rank less than or equal to the current value. The process may give assignment preference to integrals that appear linearly in the equation.

At stage 425, the process checks to see if all integral equations are assigned. If not, processing returns to stage 440 where the current PIL rank is increased. If so, processing continues to stage 430 where each equation that is assigned an integral that appears linearly may be solved. The solved value is then substituted into other equations. If due to substitutions, an assigned variable is no longer in the equation, another integral, with minimum integration rank, is assigned to it. At stage 435, the assigned or solved integral variables are eliminated.

As shown in process 115 of FIG. 1, to start the simulation, the user may specify initial condition constraints. Most prior art simulation applications only allow users to set initial conditions on integrated variables. This limitation is caused by the DAE system being processed (for transient simulation) assuming that the integrated variables are determined by numeric integration. Thus, when solving for initial conditions, the only free variables that the user can constrain are the integrated variables. In some simulation applications, users may be able to set initial conditions on derivative or algebraic variables through the use of an indirect solution method, such as optimization. Such methods are computationally very expensive and prone to convergence difficulties.

The symbolic engine of exemplary embodiments of the present invention allows users to constrain any system variable while directly solving for the initial condition solution. This flexibility is achieved by solving for the initial condition and transient solutions using two separate systems of equations that are independently processed. Both systems of equations contain component, connection, and boundary condition equations. Additionally, the initial condition system has user specified initial condition constraints, while the transient system has numeric integration equations. Another benefit of this approach is that it allows components to write different equations for the initial condition and transient systems, e.g., a torque converter component may write an additional initial condition equation to specify the initial speed ratio across the converter.

Process 117 of FIG. 1 handles numeric integration equations for the transient system. The symbolic engine of exemplary embodiments of the present invention may make no assumption about the numeric integration technique used for transient simulation. The integration technique adds equations to the transient system to constrain integrated variables. The type of equations added depend on whether the integration is explicit or implicit. An explicit integrator will add the following equation for each integral:

$$0 = x - k(h, x_{i-1}, x_{i-2}, \ldots, \dot{x}_{i-1}, \dot{x}_{i-2}, \ldots)$$

An implicit integrator will add the following equation for each integral:

$$0 = x - c(h, x_{i-1}, x_{i-2}, \ldots, \dot{x}_{i-1}, \dot{x}_{i-2}, \ldots) - k(h, x_{i-1}, x_{i-2}, \ldots, \dot{x}_{i-1}, \dot{x}_{i-2}, \ldots)\dot{x}$$

where x is the integral, $\dot{x}$ is the derivative, and c and k are functions of the step-size (h) and the history of x and/or $\dot{x}$. The symbolic engine processes the transient system equations with the added integration equations. For an implicit integrator, this inlines the numeric integration which results in a significant performance improvement.

Once the initial condition and transient system equations have been assembled, they are independently processed into a form that can be efficiently simulated.

Figure 5:
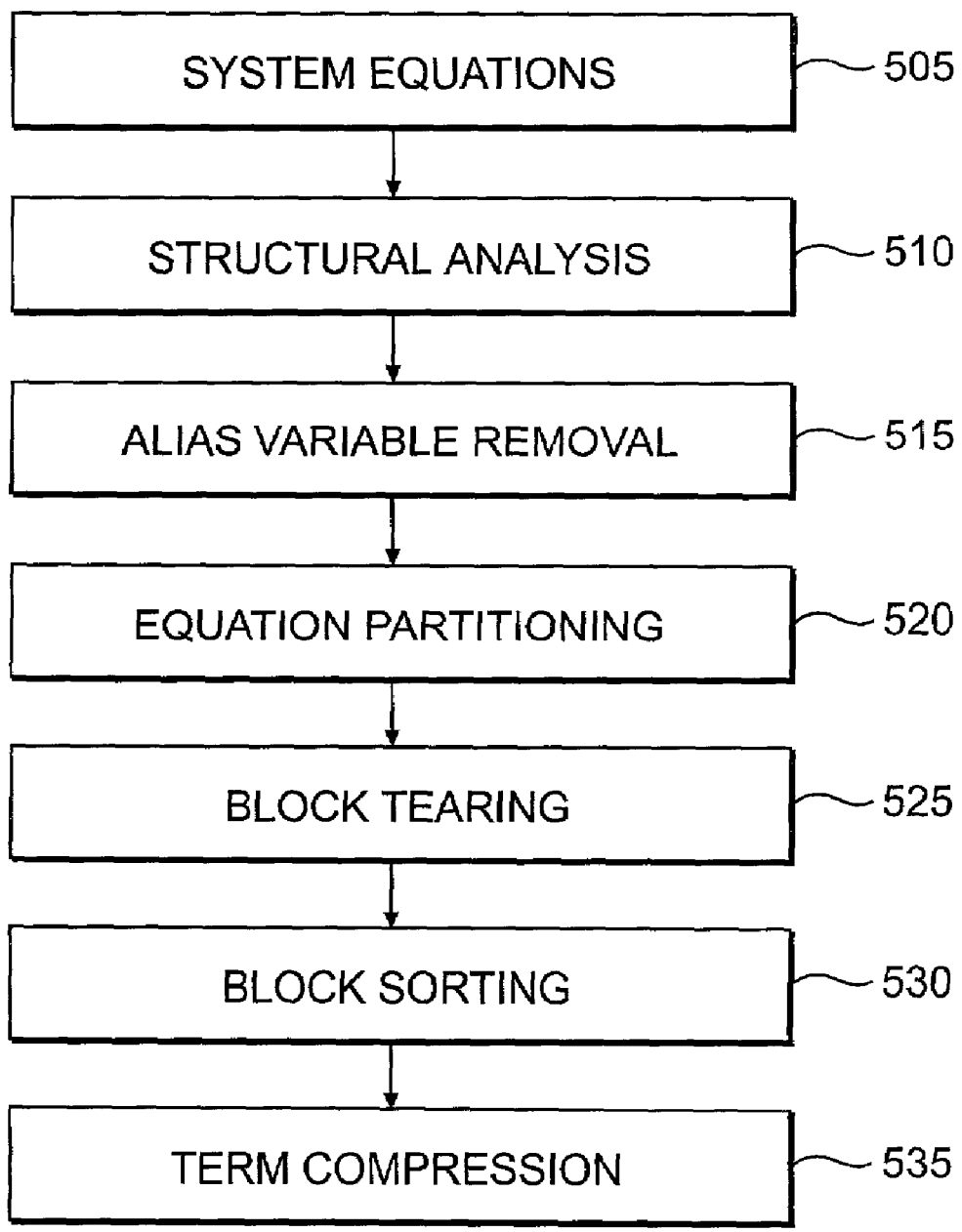
FIG. 5 is a flowchart of the system processing process of an exemplary embodiment of the present invention.

Process 121 and 127 of FIG. 1 handle system processing. FIG. 5 illustrates the system processing process of an exemplary embodiment of the present invention. At stage 505, the system equations are examined. At stage 510, the system of equations may contain structural defects such as redundant equations or unconstrained variables. These defects are usually not unique; i.e., which equation is redundant or which variable is unconstrained depends on how they are selected. The symbolic engine identifies the defects such that users can most easily take action to correct them. The identification process is based on assigning equations variables from a limited set. Multiple passes may be made increasing the set of variables that can be assigned, until no more assignments are made. The equations are sorted such that user-defined boundary and initial condition constraints are assigned last. Any remaining unassigned equations are redundant and unassigned variables are unconstrained.

The assignment passes made for the transient system may include:

1. Allow assignment to non-default boundary condition variables. Default boundary condition variables are specified by components.

2. Allow assignment to any variable.

The assignment passes made for the initial condition system may include:

1. Allow assignment to non-integral and non-default boundary condition variables.
2. Allow assignment to non-default boundary condition variables.
3. Allow assignment to any variable.

Using this multi-pass approach, any unconstrained variables will be the ones users would expect to set boundary and initial condition constraints on. By sorting the equations such that user-defined constraints are assigned last, any redundant equations will most likely be identified as incorrect user constraints, which can be easily removed.

At stage 515, alias variables are removed. The engine identifies alias variables that need not be evaluated during the simulation. For example, in the following equation:

$$0 = x + y$$

x can be considered to be an alias (scalar multiple) of y. By replacing all occurrences of x with -y, the evaluation and storage of x is avoided and potentially other system equations may be decoupled or further simplified.

At stage 520, the equations are partitioned. The symbolic engine transforms the system equations so that they can be efficiently solved during the simulation. The transformation rearranges the system into a series of subsystems or blocks that are to be solved in sequence. This process is commonly referred to as Block Lower Triangular (BLT) partitioning. The symbolic engine may use the efficient, well-known partitioning algorithm developed by Taijan and implemented by Duff.

Each block identified by partitioning is a coupled set of equations that may be solved simultaneously. For a 1×1 block i.e. a block consisting of one equation and one variable, the engine tries to symbolically solve the equation for the given variable. If the equation cannot be solved symbolically, a numeric root-finder such as Newton-Raphson is used to solve the equation during the simulation. For a N×N block i.e. a block consisting of N equations and N variables, a new tearing algorithm is used to determine how the block is solved. Tearing is a technique used to reduce the number of variables (iterates) that must be solved numerically.

At stage 525, the block tearing process occurs. The tearing algorithm developed for the engine balances reducing the number of iterates with the ease of convergence of consecutive (at each simulation step) solutions. It assumes that in each iteration, the numeric root-finder solves a linear approximation of the system as represented by the equation residuals and Jacobian. The effectiveness of the each iteration is then a function of the range of the Jacobian i.e. the range of variable values (around the current value) for which the Jacobian is approximately constant. Hence, any equation that has constant partial derivatives should be solved symbolically as their range is infinite. Solving other equations could result in non-constant partial derivatives being multiplied, thus reducing the range over which the partial derivatives are approximately constant.

Figure 6:
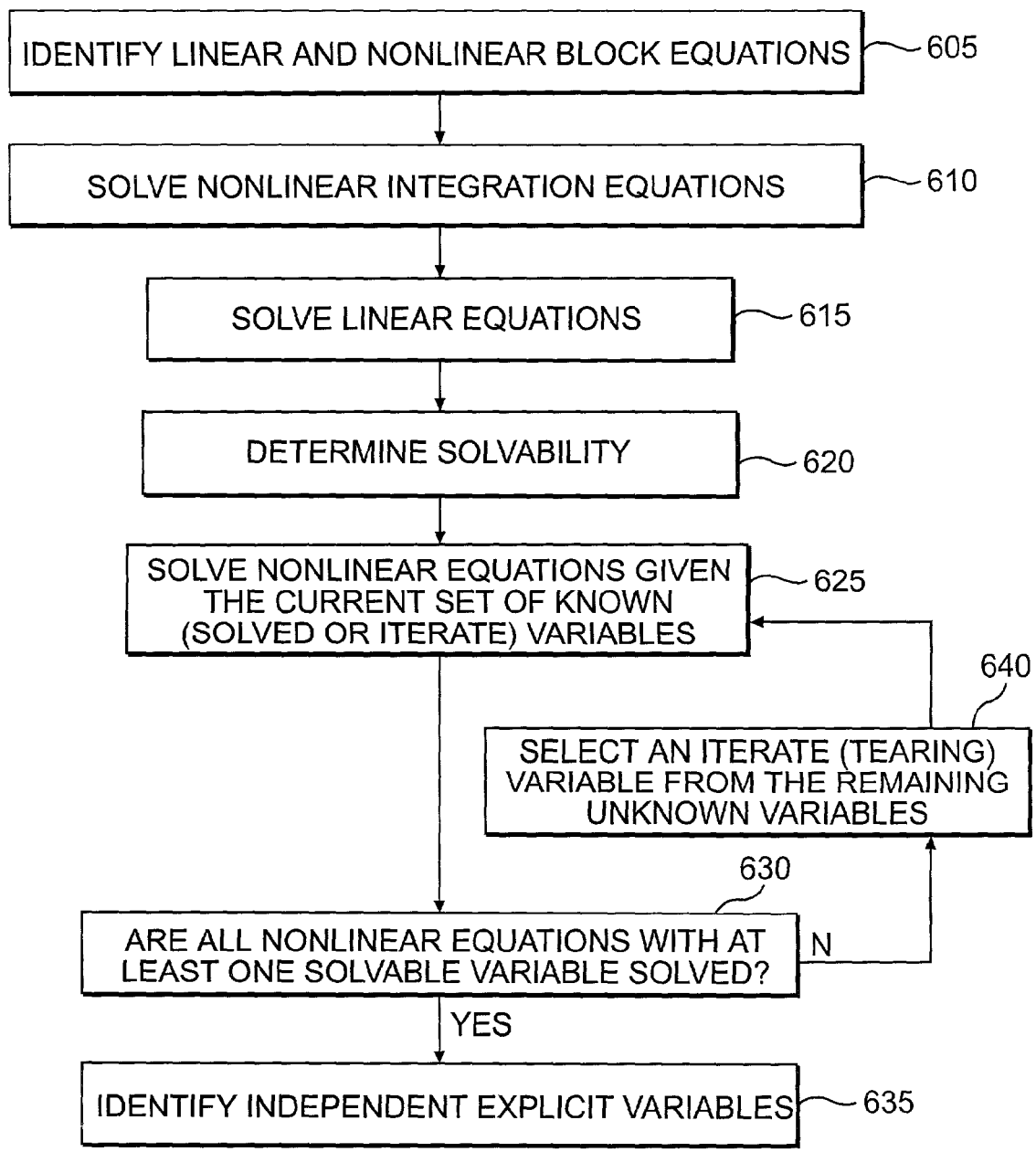
FIG. 6 is a flowchart of the block tearing process of an exemplary embodiment of the present invention.

FIG. 6 illustrates the block tearing process of an exemplary embodiment of the present invention. At stage 605, the process identifies equations in the block in which the block variables appear linearly with constant coefficients. Terms in these equations that are not functions of the block variables may be functions of other variables in the system. These equations are referred to as linear equations, and all other equations are referred to as nonlinear equations.

At stage 610, the process solves nonlinear integration equations for their respective integrals. Solving these equations first reduces the coupling in the block equations. It is assumed that the highest order derivatives are iterates.

At stage 615, the process solves the linear equations using, for example, Gauss Elimination with pivoting.

At stage 620, the process determines the solvability of the nonlinear equations. A variable in a nonlinear equation can be solved for if: a) partial derivatives with respect to all incident variables are independent of the block variables; and b) the variable appears linearly in all nonlinear equations.

At stages 625, 630 and 640, the process solves the nonlinear equations given the current set of iterates and variables solved from the linear and integration equations. The process successively adds iterates (or tearing variables) at stage 640 until no more nonlinear equations can be solved. Tearing variables may be selected based on the following criterion (given by precedence):

Cannot be solved for in any equation;
Has continuous real values;
Appears in the most number of equations i.e. couples equations; and
Can be solved for in the least number of equations.

At stage 635, the process scans the solved-for variables to identify ones that need not be evaluated to solve the block. These independent variables and their associated values are removed from the N×N block. They are added as individual 1×1 blocks to the sequence of blocks that make up the system.

Returning to stage 530 of FIG. 5, block sorting rearranges the system into a series of blocks. Partitioning guarantees that the blocks can be solved in the determined sequence, but this sequence is not unique. The symbolic engine takes partitioning a step further by sorting the blocks to minimize computational effort during simulation, while maintaining a valid evaluation sequence. The blocks are sorted into the following categories: static blocks, dynamic blocks, and output blocks.

A static block evaluates a variable that has a constant value throughout the simulation. In an exemplary embodiment of the invention, these blocks may only be evaluated once, at the start of the simulation. They have the following characteristics:

1. Symbolically solve for the block variable
2. Are only a function of variables solved for in preceding static blocks Dynamic blocks have values that have an impact on numeric integration and dynamically change during the simulation. They solve for derivatives, integrals, and/or algebraic variables, symbolically or using a numeric solution technique. These blocks may be evaluated at each step during the simulation. They are sorted to move blocks down in the sequence until they are first needed. Consecutive independent blocks are rearranged to evaluate blocks with fewer iterates first. This avoids wasting effort on solving larger blocks (ones with more iterates), if the smaller block fails to converge.

An output block evaluates a variable that does not impact the simulation or its results. These blocks are only evaluated when the user requests display of the respective variable value. Output blocks have the following characteristics:

1. Symbolically solve for the block variable;
2. Block variable is not used by a dynamic block;
3. Variable value can be evaluated post-simulation;
4. Block variable cannot be required by a component during the simulation; and
5. Block variable cannot be an integral or derivative.

Figure 7:
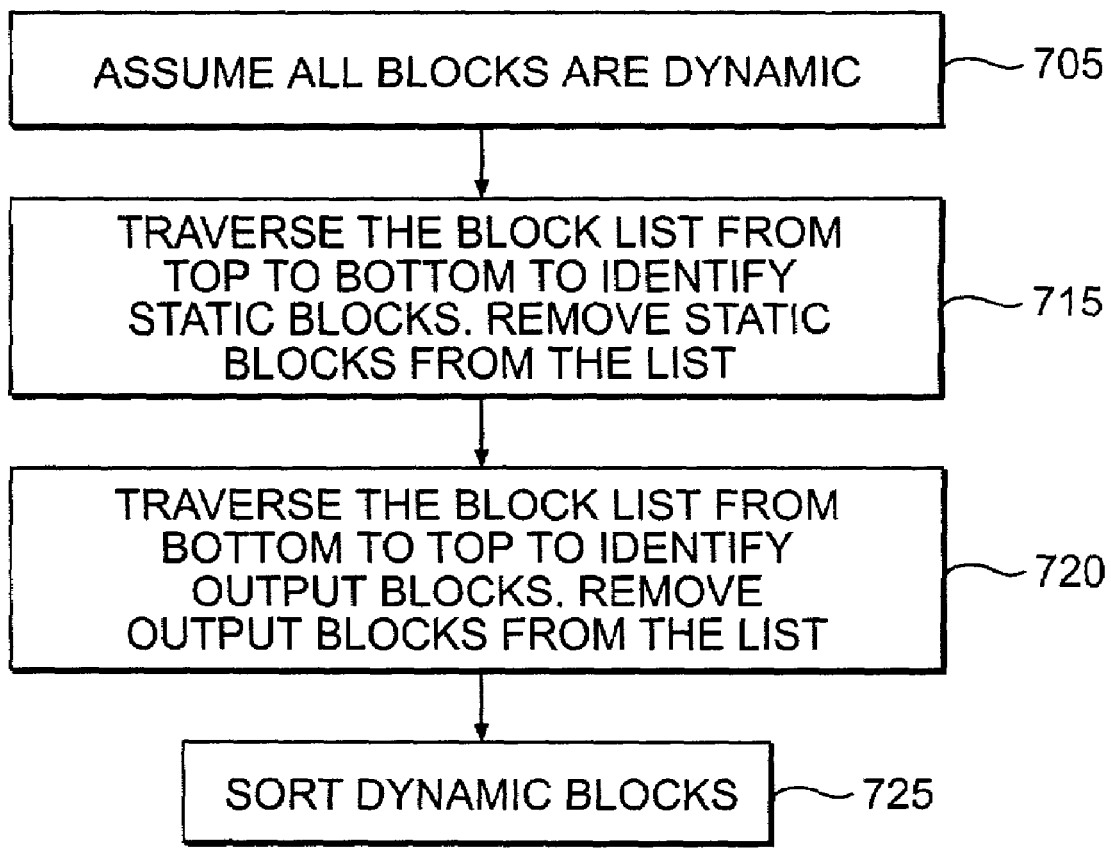
FIG. 7 is a flowchart of the block sorting process of an exemplary embodiment of the present invention.

FIG. 7 illustrates the block sorting process of an exemplary embodiment of the present invention. At stage 705, the process assumes that all blocks are dynamic. At stage 715, the block list is traversed from the top to the bottom to determine the static blocks, which are then removed from the list. At stage 720, the block list is traversed from bottom to top to identify output blocks, which are then removed from the list. At stage 725, the dynamic blocks are sorted.

Returning to FIG. 5, stage 535 processes term compression. Term compression is the process of identifying duplicate terms to avoid their redundant evaluations. This produces a substantial simulation performance improvement by reducing the computational effort required to evaluate and solve the system equations. A compressor object implements the algorithm. The compressor contains a map of terms and their respective compression keys. A compression key is a string that uniquely identifies the value of the term. The compressor traverses from top to bottom the terms in the static and dynamic blocks. Each term, in sequence, is asked for its compression key. If the key is already in the compressor's map, the term is identical to a preceding term and so it is referenced to the preceding term's value. This avoids the evaluation of the duplicate term. If the key is not in the map, the key is added to the map if its evaluation is guaranteed. For example, in the following expression $T_1$ and $T_2$ are added to the map (if not already in the map), but not $T_3$ or $T_4$ as their evaluation is dependent on $T_2$.

$$0 = T_1 - f(T_2 > 0) \text{ then } T_3 \text{ else } T_4$$

Terms that are added to the map can also add auxiliary compression keys. The auxiliary keys are references to intermediate values held by the term. For example a curve interpolation term needs to determine the slope of the curve to calculate the term's current value. The curve term may hold on to this slope and add an auxiliary key for it. If subsequently the slope of the curve term appears in the system (such as in the partial derivatives required for solution of an iterate block), the auxiliary key is referenced to avoid re-evaluating the curve slope.

Industrial Applicability

A hardware platform capable of implementing the system is now illustrated for one embodiment. By way of a non-limiting example, a system environment is described in which the features and principles of the present invention may be implemented. A system environment consistent with an embodiment of the present invention may include an input module, an output module, a computing platform, and a database. The computing platform may be adapted to include the necessary functionality and computing capabilities to implement simulations input through the input module and access, read and write to the database. The results of running the simulation are provided as output from the computing platform to the output module for printed display, viewing, or further communication to other system devices. Such output may include, for example, results of the simulation. Output from the computing platform can also be provided to the database, which may be utilized as a persistent storage device for storing, for example, a library of terms.

In embodiments of the present invention, the computing platform may comprise a PC or mainframe computer for performing various functions and operations of the invention. The computing platform may be implemented, for example, by a general purpose computer selectively activated or reconfigured by a computer program stored in the computer, or may be a specially constructed computing platform for carrying-out the features and operations of the present invention. The computing platform may also be implemented or provided with a wide variety of components or subsystems including, for example, one or more of the following: one or more central processing units, a co-processor, memory, registers, and other data processing devices and subsystems. The computing platform also communicates or transfers simulation output and input to and from the input module and the output module through the use of direct connections or communication links.

Alternatively, communication between the computing platform and the input and output modules can be achieved through the use of a network architecture. In an alternative embodiment, the network architecture may include, alone or in any suitable combination, a telephone-based network (such as a PBX or POTS), a local area network (LAN), a wide area network (WAN), a dedicated intranet, and/or the Internet. Further, the network architecture may include any suitable combination of wired and/or wireless components and systems. By using dedicated communication links or a shared network architecture, the computing platform may be located in the same location or at a geographically distant location from input module and/or output module.

The input module may be implemented with a wide variety of devices to receive and/or provide the data as input to the computing platform. The input module may include an input device, a storage device, and/or a network. The input device may include a keyboard, a mouse, a disk drive, video camera, magnetic card reader, or any other suitable input device for providing system information or modeling information to the computing platform. Memory device may be implemented with various forms of memory or storage devices, such as read-only memory (ROM) devices and random access memory (RAM) devices. The storage device may include a memory tape or disk drive for reading and providing, for example, simulation data or term library information, on a storage tape or disk, as input to the computing platform.

The output module may include a display, a printer device, and/or a network interface for receiving the results provided as output from the computing platform. As indicated above, the output from the computing platform may include one or more results of simulations. The output from the computing platform may be displayed or viewed through a display (such as a CRT or LCD) and printer device. If needed, a network interface may also be provided to facilitate the communication of the results from the computer platform over a network (such as a LAN, WAN, intranet or the Internet) to remote or distant locations for further analysis or viewing.

The preceding text describes a comprehensive symbolic engine that assembles and processes a system of equations into a form suitable for numeric simulation. The engine implements several new processes to maintain ease of model construction while enhancing simulation performance.

It will be readily apparent to those skilled in this art that various changes and modifications of an obvious nature may be made, and all such changes and modifications are considered to fall within the scope of the appended claims. Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

What is claimed is:

1. A computer-implemented method of simulating a system, comprising:
   establishing equations modeling the system using terms having characteristics encapsulated within the terms;
   symbolically processing the established equations for simplification, wherein the symbolic processing includes:
      utilizing the Pantelides algorithm to reduce the established equations; and eliminating an integral, wherein eliminating an integral includes assigning a preferred integration location rank to one or more integrals;

processing system equations for efficient simulation, wherein processing the system equations includes:

processing a first set of equations including equations modeling the system and initial condition constraints; and processing a second set of equations including equations modeling the system and numeric integration equations;

simulating the system using the processed equations; and displaying results of the simulation.

2. The method of claim 1, wherein the stage of defining equations further includes:

defining equations modeling the system using terms selected from one or more basic terms, composite terms, or collection terms.

3. The method of claim 1, further including:

extending a library of terms by defining new term classes, wherein term classes define objects having characteristics encapsulated within the objects.

4. The method of claim 1, further including:

defining a term group including one or more terms having related functionality;

evaluating each term within the term group upon an initial request for evaluation of any of the one or more terms within the term group;

storing the result of the evaluation for each of the one or more terms within the term group; and recalling the stored value of the evaluated one or more terms from the term group upon a subsequent request for evaluation of the one or more terms, without performing the evaluation stage.

5. The method of claim 1, wherein utilizing the Pantelides algorithm includes reducing the established equations to a system of equations having a differential-algebraic system of equations index of at most one.

6. The method of claim 5, wherein utilizing the Pantelides algorithm further includes:

assigning equations to variables that have non-zero partial derivatives; and differentiating the remainder of the equations.

7. The method of claim 5, wherein utilizing the Pantelides algorithm further includes:

approximating an algebraic derivative for those equations that cannot be symbolically differentiated.

8. The method of claim 5, wherein utilizing the Pantelides algorithm further includes:

symbolically integrating equations that cannot be assigned.

9. The method of claim 5, wherein utilizing the Pantelides algorithm further includes:

differentiating equations that add output derivates and integrating equations that add output integrals.

10. The method of claim 5, wherein eliminating an integral further includes:

eliminating an integral as each symbolically differentiated or integrated equation eliminates a numeric integration, such that the integral is converted to an algebraic variable by eliminating the derivative or integral relationship.

11. The method of claim 10, wherein eliminating an integral further includes:

utilizing the preferred integration location rank, assigning integrals to equations; and eliminating the integration of assigned or solved integral variables.

12. The method of claim 1, wherein assigning a preferred integration location rank further includes:

assigning a preferred integration location to one or more integrals, a user assigned preferred integration location being given the highest available preferred integration location rank;

assigning a preferred integration location rank, wherein the preferred integration location rank has a lower rank than the user defined preferred integration location rank; and assigning all other integration locations a default lowest rank.

13. The method of claim 12, wherein the assigned preferred integration location is assigned by a user.

14. The method of claim 12, wherein the assigned preferred integration location rank is assigned by a component developer.

15. The method of claim 12, wherein utilizing the preferred integration location ranks to assign integrals to equations further includes:

identifying integral variables that appear linearly and non-linearly in the integral equations;

establishing a current preferred integration location rank at a default setting;

assigning each integral equation an integral variable that has a preferred integration location rank of less than the current preferred integration location rank, and, if possible, appears linearly in the equation; and repeating the previous three stages after increasing the current preferred integration location rank until a maximum preferred integration location rank has been exceeded.

16. The method of claim 15, further including: solving each integral equation that is assigned an integral variable that appears linearly in the integral equation;

substituting the solved value into other equations; and if due to substitutions, one of the assigned variables is no longer in the equation, assigning another integral with a minimum integration rank to the one of the assigned variables.

17. The method of claim 1, wherein the stage of performing system processing includes:

establishing an initial condition system using the first set of equations and establishing a transient system using the second set of equations.

18. The method of claim 1, wherein processing a first set of equations includes:

processing a first set of equations including equations modeling the system and user-defined and component-defined initial condition constraints.

19. The method of claim 1, wherein performing system processing includes:

performing the system processing on the first set of equations and the second set of equations independently and in parallel.

20. The method of claim 1, wherein system processing further includes:

replacing alias variables;

partitioning the equations into blocks;

tearing the blocks;

sorting the blocks; and compressing equation terms.

21. The method of claim 20, wherein tearing the equations includes:
identifying block variables in the equations in the block in which the block variables appear linearly with constant coefficients;
solving nonlinear integration equations for their respective integrals;
solving the linear equations;
determining the solvability of the nonlinear equations;
solving the nonlinear equations utilizing iterates and block variables solved from the linear equations; and
scanning the solved variables for identification of variables that are independent and may be removed from the block.

22. The method of claim 20, wherein block sorting further includes:
defining and identifying the blocks as static blocks, dynamic blocks, or output blocks;
removing the static blocks from a list of blocks; and
removing the output blocks from the list of blocks.

23. A computer-readable storage medium having stored thereon instructions which, when executed by a computer, cause the computer to perform a method of simulating a system, the method comprising:
defining equations modeling the system using terms having characteristics encapsulated within the terms;
symbolically processing the established equations for simplification, wherein the symbolic processing includes:
utilizing the Pantelides algorithm to reduce the established equations; and
eliminating an integral, wherein eliminating an integral includes assigning a preferred integration location rank to one or more integrals;
processing system equations for efficient simulation, wherein processing the system equations includes:
processing a first set of equations including equations modeling the system and initial condition constraints; and
processing a second set of equations including equations modeling the system and numeric integration equations;
simulating the system using the processed equations; and
displaying results of the simulation.

24. The computer-readable storage medium of claim 23, wherein defining equations further includes:
defining equations modeling the system using terms selected from one or more basic terms, composite terms, or collection terms.

25. The computer-readable storage medium of claim 23, wherein the method further includes:
extending a library of terms by defining new term classes, wherein term classes define objects having characteristics encapsulated within the objects.

26. The computer-readable storage medium of claim 23, wherein the method further includes:
defining a term group including one or more terms having related functionality;
evaluating each term within the term group upon an initial request for evaluation of any of the one or more terms within the term group;
storing the result of the evaluation for each of the one or more terms within the term group; and
recalling the stored value of the evaluated one or more terms from the term group upon a subsequent request for evaluation of the one or more terms, without performing the evaluation stage.

27. The computer-readable storage medium of claim 23, wherein utilizing the Pantelides algorithm includes reducing the established equations to a system of equations having a differential-algebraic system of equations index of at most one.

28. The computer-readable storage medium of claim 27, wherein utilizing the Pantelides algorithm further includes:
assigning equations to variables that have non-zero partial derivatives; and
differentiating the remainder of the equations.

29. The computer-readable storage medium of claim 27, wherein utilizing the Pantelides algorithm further includes:
approximating an algebraic derivative for those equations that cannot be symbolically differentiated.

30. The computer-readable storage medium of claim 27, wherein utilizing the Pantelides algorithm further includes:
symbolically integrating equations that cannot be assigned.

31. The computer-readable storage medium of claim 27, wherein utilizing the Pantelides algorithm further includes:
differentiating equations that add output derivates and integrating equations that add output integrals.

32. The computer-readable storage medium of claim 27, wherein eliminating an integral further includes:
eliminating an integral as each symbolically differentiated or integrated equation eliminates a numeric integration, such that the integral is converted to an algebraic variable by eliminating the derivative or integral relationship.

33. The computer-readable storage medium of claim 23, wherein eliminating an integral further includes:
utilizing the preferred integration location rank, assigning integrals to equations; and
eliminating the integration of assigned or solved integral variables.

34. The computer-readable storage medium of claim 23, wherein assigning a preferred integration location rank further includes:
assigning, by a user, a preferred integration location to one or more integrals, the user assigned preferred integration location being given the highest available preferred integration location rank;
assigning, by a component developer, a preferred integration location rank, wherein the preferred integration location rank has a lower rank than the user defined preferred integration location rank; and
assigning all other integration locations a default lowest rank.

35. The computer-readable storage medium of claim 34, wherein utilizing the preferred integration location ranks to assign integrals to equations further includes:
identifying integral variables that appear linearly and non-linearly in the integral equations;
establishing a current preferred integration location rank at a default setting;
assigning each integral equation an integral variable that has a preferred integration location rank of less than the current preferred integration location rank and, if possible, appears linearly in the equation; and
repeating the previous three stages after increasing the current preferred integration location rank until a maximum preferred integration location rank has been exceeded.

36. The computer-readable storage medium of claim 35, wherein the method further includes:
solving each integral equation that is assigned an integral variable that appears linearly in the integral equation;
substituting the solved value into other equations; and if due to substitutions, one of the assigned variables is no longer in the equation, assigning another integral with a minimum integration rank to the one of the assigned variables.

37. The computer-readable storage medium of claim 23, wherein performing system processing includes:
    establishing an initial condition system using the first set of equations; and
    establishing a transient system using the second set of equations.

38. The computer-readable storage medium of claim 23, wherein processing a first set of equations includes:
    processing a first set of equations including equations modeling the system and user-defined and component-defined initial condition constraints.

39. The computer-readable storage medium of claim 23, wherein performing system processing includes:
    performing the system processing on the first set of equations and the second set of equations independently and in parallel.

40. The computer-readable storage medium of claim 23, wherein processing system equations further includes:
    replacing alias variables;
    partitioning the equations into blocks;
    tearing the blocks;
    sorting the blocks; and
    compressing equation terms.

41. The storage computer-readable storage medium of claim 40, wherein tearing the block includes:
    identifying block variables in the equations in the block in which the block variables appear linearly with constant coefficients;
    solving nonlinear integration equations for their respective integrals;
    determining the solvability of the nonlinear equations;
    solving the nonlinear equations utilizing iterates and block variables solved from the linear equations;
    solving the linear equations; and
    scanning the solved variables for identification of variables that are independent and may be removed from the block.

42. The computer-readable storage medium of claim 40, wherein block sorting the blocks further includes:
    defining and identifying the blocks as static blocks, dynamic blocks, or output blocks;
    removing the static blocks from a list of blocks; and
    removing the output blocks from the list of blocks.

43. A computer-implemented method of simulating a system, comprising:
    symbolically processing a set of equations that model the system, including:
        assigning a portion of the set of equations to variables that have non-zero partial derivatives;
        differentiating the remainder of the set of equations;
        approximating an algebraic derivative for those equations that cannot be symbolically differentiated;
        symbolically integrating equations that cannot be assigned;
        differentiating equations that add output derivates and integrating equations that add output integrals;
        eliminating an integral as each symbolically differentiated or integrated equation eliminates a numeric integration, such that the integral is converted to an algebraic variable by eliminating the derivative or integral relationship, wherein eliminating an integral includes assigning a preferred integration location rank to one or more integrals;
    simulating the system based on the symbolically processed set of equations; and
    communicating results of the simulation to an external device.

44. A computer-readable storage medium having instructions stored thereon which, when executed by a computer, cause the computer to perform a method of simulating a system, the method comprising:
    symbolically processing a set of equations, including:
        assigning a portion of the set of equations to variables that have non-zero partial derivatives;
        differentiating the remainder of the set of equations;
        approximating an algebraic derivative for those equations that cannot be symbolically differentiated;
        symbolically integrating equations that cannot be assigned;
        differentiating equations that add output derivates and integrating equations that add output integrals;
        eliminating an integral as each symbolically differentiated or integrated equation eliminates a numeric integration, such that the integral is converted to an algebraic variable by eliminating the derivative or integral relationship, wherein eliminating an integral includes assigning a preferred integration location rank to one or more integrals;
    simulating the system based on the symbolically processed set of equations; and
    communicating results of the simulation to an external device.

45. A computer-implemented method of eliminating an integral in a Pantelides algorithm performed by a computer-based application that simulates a system, comprising:
    assigning a preferred integration location rank to one or more integrals;
    utilizing the preferred integration location rank, assigning integrals to equations modeling the system;
    eliminating from the equations the integration of assigned or solved integral variables;
    simulating the system using the equations; and
    displaying results of the simulation.

46. The method of claim 45, wherein assigning a preferred integration location rank, further includes:
    assigning, by a user, a preferred integration location to one or more integrals, the user assigned preferred integration location being given the highest available preferred integration location rank;
    assigning, by a component developer, a preferred integration location rank, wherein the preferred integration location rank has a lower rank than the user defined preferred integration location rank; and
    assigning all other integration locations a default lowest rank.

47. The method of claim 46, wherein utilizing the preferred integration location ranks to assign integrals to equations, further includes:
    identifying integral variables that appear linearly and non-linearly in the integral equations;
    establishing a current preferred integration location rank at a default setting;
    assigning each integral equation an integral variable that has a preferred integration location rank of less than the current preferred integration location rank and, if possible, appears linearly in the equation; and
    repeating the previous three stages after increasing the current preferred integration location rank until a maximum preferred integration location rank has been exceeded.

48. The method of claim 47, further including:
solving each integral equation that is assigned an integral variable that appears linearly in the integral equation;
substituting the solved value into other equations; and if due to substitutions, one of the assigned variables is no longer in the equation, assigning another integral with a minimum integration rank to the one of the assigned variables.

49. A computer-readable storage medium having instructions stored thereon which, when executed by a computer, cause the computer to perform a method of eliminating an integral in a Pantelides algorithm in an application that simulates a system, the method comprising:
assigning a preferred integration location rank to one or more integrals;
utilizing the preferred integration location rank, assigning integrals to equations defining the system;
eliminating from the equations the integration of assigned or solved integral variables;
simulating the system using the equations; and
displaying results of the simulation.

50. The computer-readable storage medium of claim 49, wherein assigning a preferred integration location rank further includes:
assigning, by a user, a preferred integration location to one or more integrals, the user assigned preferred integration location being given the highest available preferred integration location rank;
assigning, by a component developer, a preferred integration location rank, wherein the preferred integration location rank has a lower rank than the user defined preferred integration location rank; and
assigning all other integration locations a default lowest rank.

51. The computer-readable storage medium of claim 50, wherein utilizing the preferred integration location ranks to assign integrals to equations further includes:
identifying integral variables that appear linearly and non-linearly in the integral equations;
establishing a current preferred integration location rank at a default setting;
assigning each integral equation an integral variable that has a preferred integration location rank of less than the current preferred integration location rank and, if possible, appears linearly in the equation; and
repeating the previous three stages after increasing the current preferred integration location rank until a maximum preferred integration location rank has been exceeded.

52. The computer-readable storage medium of claim 51, wherein the method further includes:
solving each integral equation that is assigned an integral variable that appears linearly in the integral equation;
substituting the solved value into other equations; and if due to substitutions, one of the assigned variables is no longer in the equation, assigning another integral with a minimum integration rank to the one of the assigned variables.

53. A computer-implemented method of simulating systems, comprising:
performing a tearing process on a set of equations modeling a system, including:
identifying block variables in the equations in a block in which the block variables appear linearly with constant coefficients;
determining the solvability of the nonlinear equations;
solving nonlinear integration equations for their respective integrals;
solving the linear equations;
solving the nonlinear equations utilizing iterates and block variables solved from the linear equations;
scanning for solved for variables for identification of variables that are independent and may be removed from the block;
simulating the system using the processed equations, and
displaying results of the simulation.

54. A computer-readable storage medium having stored thereon instructions which, when executed by a computer, cause the computer to perform a method of simulating a system, the method comprising:
performing a tearing process on a set of equations modeling a system, including:
identifying block variables in the equations in a block in which the block variables appear linearly with constant coefficients;
solving nonlinear integration equations for their respective integrals;
solving the linear equations;
determining the solvability of the nonlinear equations;
solving the nonlinear equations utilizing iterates and block variables solved from the linear equations;
scanning for solved for variables for identification of variables that are independent and may be removed from the block;
simulating the system using the processed equations; and
displaying results of the simulation.

55. A computer-implemented method of simulating a system, comprising:
establishing equations modeling the system using terms having characteristics encapsulated within the terms;
symbolically processing the established equations for reducing the number of terms in the equations, wherein the symbolic processing reduces the established equations by eliminating an integral, wherein eliminating an integral includes assigning a preferred integration location rank to one or more integrals;
processing system equations for efficient simulation, wherein processing the system equations includes;
processing a first set of equations including equations modeling the system and initial condition constraints; and
processing a second set of equations including equations modeling the system and numeric integration equations;
simulating the system using the processed equations; and
communicating results of the simulation to an external device.

56. The method of claim 55, further including:
defining a term group including one or more terms having related functionality;
evaluating each term within the term group upon an initial request for evaluation of any of the one or more terms within the term group; and
storing the result of the evaluation for each of the one or more terms within the term group.

57. The method of claim 56, further including:
recalling the stored value of the evaluated one or more terms from the term group upon a subsequent request for evaluation of the one or more terms, without performing the evaluation stage.

58. A computer-implemented method of simulating a component of a system, comprising:
- establishing equations modeling the component using terms having characteristics encapsulated within the terms;
- symbolically processing the established equations for simplification, wherein the symbolic processing reduces the established equations by eliminating an integral, wherein eliminating an integral includes assigning a preferred integration location rank to one or more integrals;
- processing system equations for efficient simulation, wherein processing system equations includes:
  - processing a first set of equations including equations modeling the component and initial condition constraints; and
  - processing a second set of equations including equations modeling the component and numeric integration equations;
- simulating the component using the processed equations; and
- displaying results of the simulation.

59. A computer-implemented method of simulating a system, comprising:
- establishing equations modeling the system;
- symbolically processing the established equations for simplification, wherein the symbolic processing reduces the established equations by eliminating an integral, wherein eliminating an integral includes assigning a preferred integration location rank to one or more integrals;
- establishing a first set of equations including equations modeling the system and initial condition constraints;
- establishing a second set of equations including equations modeling the system and numeric integration equations that constrain integrated variables;
- processing the first and second sets of equations independently and in parallel, to generate initial condition and transient solutions; and
- simulating the system using the processed equations; and
- displaying results of the simulation.

60. The method of claim 59, wherein establishing equations modeling the system comprises establishing component equations, connectivity equations, and boundary condition equations; and wherein each of the first and second set of equations includes component, connectivity, and boundary condition equations.

* * * * *

UNITED STATES PATENT AND TRADEMARK OFFICE
CERTIFICATE OF CORRECTION

PATENT NO. : 7,415,395 B2
APPLICATION NO. : 10/024359
DATED : August 19, 2008
INVENTOR(S) : Mohammed Khan It is certified that error appears in the above-identified patent and that said Letters Patent is hereby corrected as shown below:

Please correct the References Cited as follows:
On the title page, item (56), under "Other Publications", in Column 2, Line 1, delete "®" and insert -- © --.

On the title page, item (56), under "Other Publications", in Column 2, Line 11, delete "®" and insert -- © --.

Page 2, item (56), under "Other Publications", in Column 1, Line 5, delete ">" and insert -- ~ --.

Page 2, item (56), under "Other Publications", in Column 2, Line 2, delete "abstracts." and insert -- abstracts/. --.

Column 4, line 49, after "$T_2+$" insert -- ... --.

Column 8, line 34, delete "$,\dot{x}_{i-2}...)\ddot{x}$" and insert -- $\dot{x}_{i-2},...)\dot{x}$ --.

Column 9, line 30, delete "Taijan" and insert -- Tarjan --.

Column 11, line 24, delete "f" and insert -- if --.

UNITED STATES PATENT AND TRADEMARK OFFICE
CERTIFICATE OF CORRECTION

PATENT NO. : 7,415,395 B2
APPLICATION NO. : 10/024359
DATED : August 19, 2008
INVENTOR(S) : Mohammed Khan It is certified that error appears in the above-identified patent and that said Letters Patent is hereby corrected as shown below:

Please correct the Claims as follows:
Column 20, line 9, in claim 53, delete "equations," and insert -- equations; --.

Column 20, line 44, in claim 55, delete "includes;" and insert -- includes: --.

Signed and Sealed this

Twenty-fourth Day of March, 2009

JOHN DOLL
*Acting Director of the United States Patent and Trademark Office*